(12) United States Patent
Jain

(10) Patent No.: US 6,628,551 B2
(45) Date of Patent: Sep. 30, 2003

(54) REDUCING LEAKAGE CURRENT IN MEMORY CELLS

(75) Inventor: Raj Kumar Jain, Singapore (SG)

(73) Assignee: Infineon Technologies Aktiengesellschaft, Munich (DE)

( * ) Notice: Subject to any disclaimer, the term of this patent is extended or adjusted under 35 U.S.C. 154(b) by 85 days.

(21) Appl. No.: 09/855,151

(22) Filed: May 14, 2001

(65) Prior Publication Data

US 2002/0167845 A1 Nov. 14, 2002

Related U.S. Application Data

(63) Continuation-in-part of application No. 09/615,987, filed on Jul. 14, 2000, now Pat. No. 6,304,478.

(51) Int. Cl.[7] .............................................. G11C 11/34
(52) U.S. Cl. ........................................ 365/187; 365/63
(58) Field of Search ................................... 365/187, 63

(56) References Cited

U.S. PATENT DOCUMENTS

| | | | | |
|---|---|---|---|---|
| 5,796,650 A | * | 8/1998 | Wik et al. ................... 365/150 |
| 5,986,932 A | * | 11/1999 | Ratnakumar et al. .. 365/185.07 |
| 6,301,146 B1 | * | 10/2001 | Ang et al. ................... 365/154 |
| 6,366,493 B1 | * | 4/2002 | Hsiao et al. ................. 365/154 |
| 6,370,052 B1 | * | 4/2002 | Hsu et al. .................... 365/154 |
| 6,388,934 B1 | * | 5/2002 | Tobita ......................... 365/149 |
| 6,404,670 B2 | * | 6/2002 | Shau .......................... 365/154 |
| 6,442,060 B1 | * | 8/2002 | Leung et al. ................ 365/154 |

\* cited by examiner

Primary Examiner—Vu A. Le
Assistant Examiner—Tuan T. Nguyen
(74) Attorney, Agent, or Firm—Dexter Chin

(57) ABSTRACT

A memory cell having first and second access transistors coupled to a storage transistor is disclosed. The access transistors are high gate threshold voltage transistors to reduce leakage current in the memory cell. The gate threshold voltage of the access transistors are, for example, 0.1 to 0.4V higher than typical transistors. Reducing leakage current advantageously improves the retention time of the memory cell.

17 Claims, 6 Drawing Sheets

REDUCING LEAKAGE CURRENT IN MEMORY CELLS

This is a continuation-in-part of patent application titled: "Layout for a SemiConductor Memory", U.S. Ser. No. 09/615,987 filed Jul. 14, 2000 now U.S. Pat. No. 6,304,478.

FIELD OF THE INVENTION

The present invention relates generally to memory cells. More particularly, the invention relates to memory cells having improved retention time.

BACKGROUND OF THE INVENTION

Integrated circuits (ICs) such as digital signal processors (DSPs) include on-chip memory to store information. The on-chip memory typically comprises, for example, an array of static random access memory (SRAM) cells connected by word lines in one direction and bit lines in another direction. The information stored in the SRAM cells are maintained until power is removed from the IC. Sense amplifiers are coupled to the bit lines to facilitate memory accesses, such as reads or writes. A sense amplifier is coupled to a pair of bit lines and senses a differential voltage indicative of the information stored in the selected memory cell on the bit line pair.

FIG. 1 shows a conventional SRAM cell 101. The SRAM cell comprises first and second transistors 110 and 120 coupled to a latch 130, which stores a bit of information. One transistor is coupled to a bit line 140 and the other is coupled to a bit line complement 141 while the gates are coupled to a word line 135. The latch includes first and second inverters 133 and 134, each implemented with two transistors. As such, the SRAM cell is realized using six transistors.

Smaller SRAM cells using less than six transistors have been proposed to reduce chip size. However, the charge stored in such cells dissipates overtime due to current leakage. To prevent the charge from dissipateing below an undefined logic level (logic 0 or 1), the memory cell must be refreshed. Typically, refreshing of memory cells interrupt the normal operation, thus adversely impacting the performance of the IC.

As evidenced from the above discussion, it is desirable to provide a memory cell with improved charge retention to decrease the refresh frequently.

SUMMARY OF THE INVENTION

The present invention relates generally to memory cells. More particularly, the invention relates to improving retention time in memory cells. In one embodiment, the memory cell comprises first and second access transistors coupled to respective first and second terminals of a storage transistor. The access transistors are high gate threshold voltage transistors. Providing access transistors having a high gate threshold voltage reduces leakage current through their channels. In one embodiment, the gate threshold voltages of the access transistors are about 0.1–0.4V higher than typical transistors.

PREFERRED EMBODIMENTS OF THE INVENTION

Figure 1:
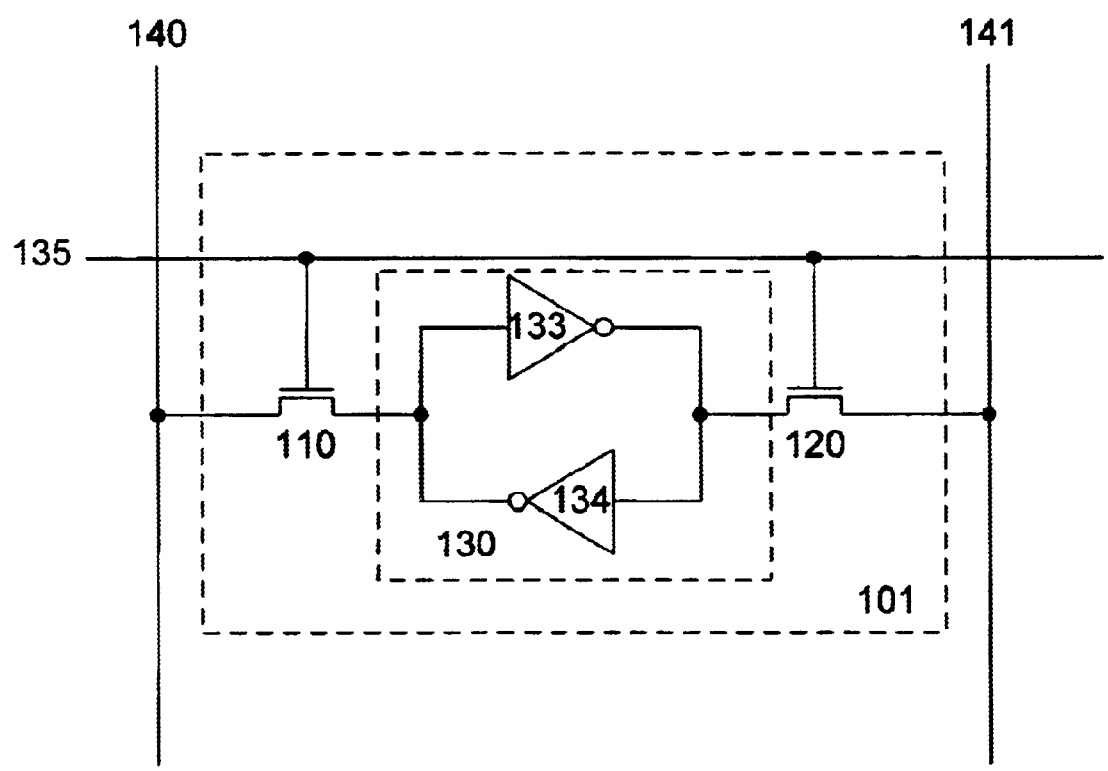
FIG. 1 shows a conventional SPAM cell.
Figure 2:
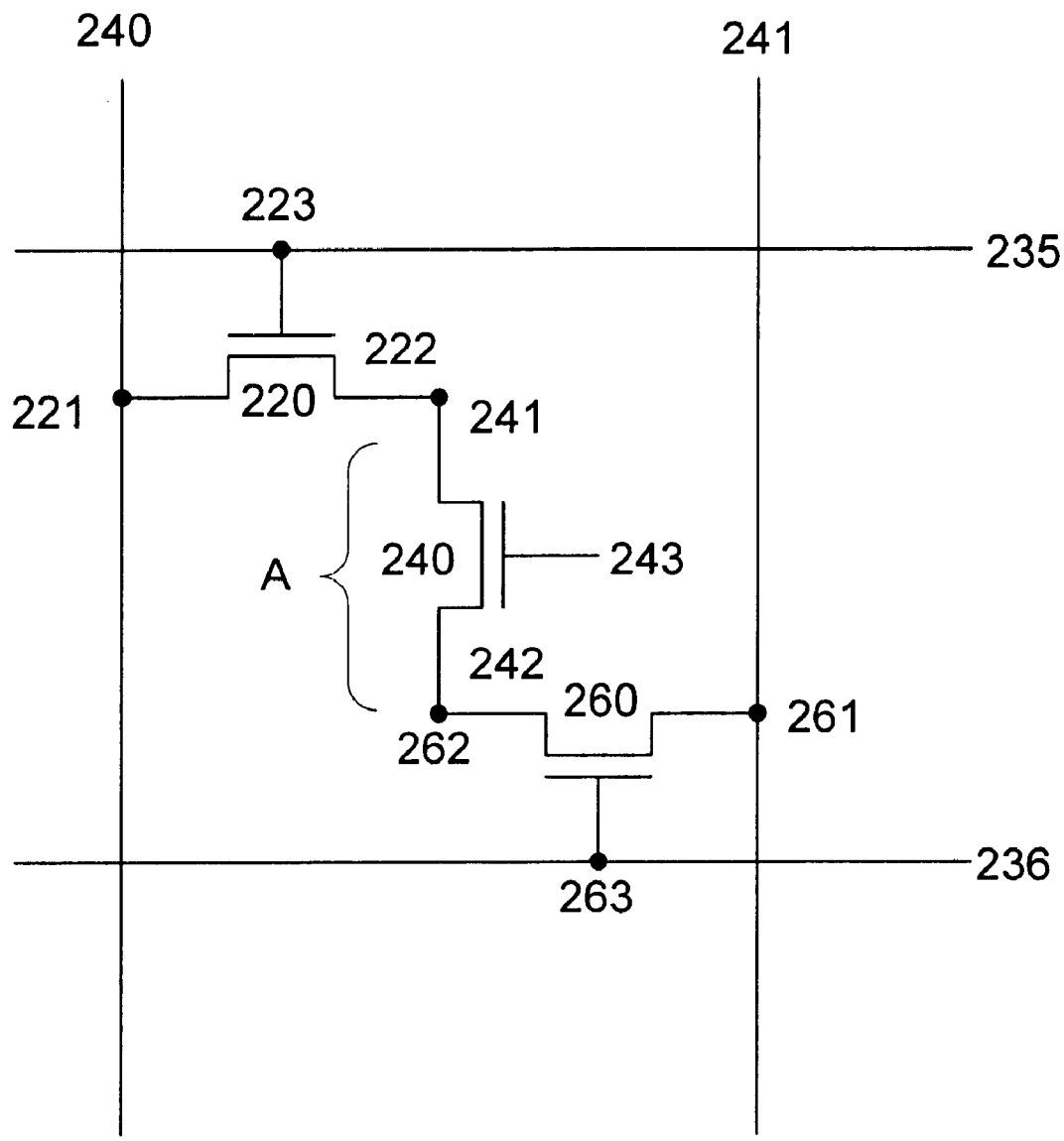
FIG. 2 shows a memory cell in accordance with one embodiment of the invention.

FIG. 2 shows a memory cell 201 in accordance with one embodiment of the invention. The memory cell comprises first and second access transistors 220 and 260 coupled to a storage transistor 240. The transistors, in one embodiment, are n-FETs. Implementing the memory cell with p-FETs or a combination of n and p-FETs is also useful.

The access transistors serve as memory access ports, each coupled to a bit line (240 or 241) and a word line (235 or 236). In one embodiment, the first access transistor's first terminal 221 is coupled to the bit line 240 and its gate is coupled to the word line 235. Similarly, the second access transistor's first terminal 261 is coupled to bit line 241 and its gate is coupled to word line 236. The memory cell can be accessed either through the first or second port. Refreshing of the memory cell are also performed through the access ports.

Second terminals 222 and 262 of the access transistors are respectively coupled to first and second terminals 241 and 242 of the storage transistor. A gate 243 of the storage transistor is coupled to an active signal to render the transistor conductive. In one embodiment, the storage transistor is an n-FET having its gate coupled to $V_{DD}$. In a preferred embodiment, the gate of the storage transistor is coupled to $V_{DD}+V_T+\Delta V$, where $V_T$ is the gate threshold voltage of the storage transistor and $\Delta V$ is for example, about 0.1–0.3V to ensure the logic voltage stored in the storage transistor is about $V_{DD}$. When power is applied to the IC, the storage transistor is rendered conductive. As a result, the first and second terminals are coupled together to form the storage node (node A). When power is removed from the IC, the first and second terminals are isolated from each other.

A memory access from the first port is performed by activating the word line 235 (e.g., logic 1) to render the first access transistor conductive. As a result, node A is coupled to the bit line via the first access transistor's first terminal 221. During a read access, the charge stored at node A is transferred to the bit line. For a write access, the charge on the bit line (generated by write circuitry) is transferred to node A. Accessing the second port of the memory cell is achieved by selecting the word line 236 to couple node A to the bit line 241. A refresh can be performed in the first or second port by activating the first or second word line.

In another embodiment, the first port of the memory cell serves as an access port and the second port of the memory cell serves as a dedicated refresh port from which refreshes are performed. The first port is coupled to a bit line and a word line while the refresh port is coupled to a refresh bit line and a refresh word line. The operation of such a memory cell is described in concurrently filed patent application titled: Memory Architecture with Refresh and Sense Amplifiers" U.S. Ser. No. 09/855,147 (attorney docket number 00E 16984SG), which is herein incorporated by reference for all purposes.

Figure 3:
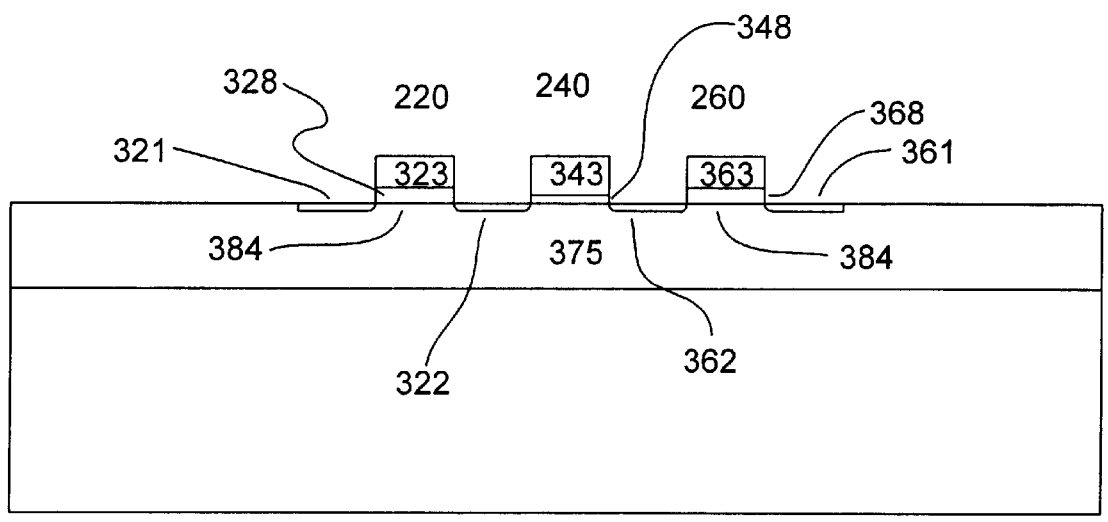
FIG. 3 shows a cross-section of a memory cell in accordance with one embodiment of the invention.

FIG. 3 shows a cross-section of a memory cell in accordance with one embodiment of the invention. A semiconductor substrate 301 is provided on which the memory cell is formed. Typically, the substrate is lightly doped with p-type dopants. The memory cell comprises first, second, and third transistors 220, 240, and 260, each having a gate and first and second diffusion regions. In one embodiment, the transistors are n-FETs. Implementing the memory cell with p-FETs or a combination of p and n-FETs is also useful. A heavily doped p-type well 375 is provided for the n-FETs of the memory cell. Various layouts for the transistors, such as those described in parent patent application titled: "Layout for a SemiConductor Memory", U.S. Ser. No. 09/615, 987 (attorney docket number: 98P 2864US) and which is herein incorporated by reference for all purposes, can be used.

In one embodiment the first and third transistors serve as access ports and the second transistor serves as a storage node. A gate 323 of the first transistor is coupled to a first word line and a gate 363 of transistor 360 is coupled to a second word line. Diffusion regions 321 and 361 of the first and third transistors are respectfully coupled to first and second bit lines. In one embodiment, second diffusion regions 322 and 362 are shred between the access and storage transistors. A gate 343 of the second transistor is coupled to an active voltage supply to keep its channel conductive in the inversion region when the IC is switched on. In one embodiment, the voltage supply is equal to a logic 1. In a preferred embodiment, the voltage supply is equal to $V_{DD}+\Delta V$ to keep the transistor in the inversion region for maximum capacitance. In one embodiment $\Delta V$ is equal to about 0.1–0.3V.

In accordance with one embodiment of the invention, the gate threshold voltage ($V_{Ta}$) of the access transistors is increased to reduce the leakage current through their channels 384. The $V_{Ta}$ is increased by, for example, about 0.1–0.4V. Preferably, $V_{Ta}$ is increased by about 0.3–0.4V. In one embodiment, the increase in $V_{Ta}$ is achieved by increasing the thickness of the access transistor's gate oxide 380. Other techniques for increasing the $V_{Ta}$, such as changing the implant energies or implant doses can also be useful. For example, the doping profile in the channel of the access transistor can be tailored to result in an increase in $V_{Ta}$. By reducing the leakage current through the access transistors, the retention time of the memory cell is improved.

In an alternative embodiment, the capacitance of the storage node is increased to improve the memory cell's retention time. In accordance with one embodiment of the invention, the thickness of the gate oxide 348 of the storage transistor is reduced to increase the storage capacitance. Decreasing the thickness of the gate oxide lowers the gate threshold voltage of the storage transistor ($V_{Ts}$). Typically, the $V_{Ts}$ of the storage transistor is reduced to below, for example, 0.7V. In one embodiment, $V_{TS}$ is about 0.3–0.5V.

Figure 4:
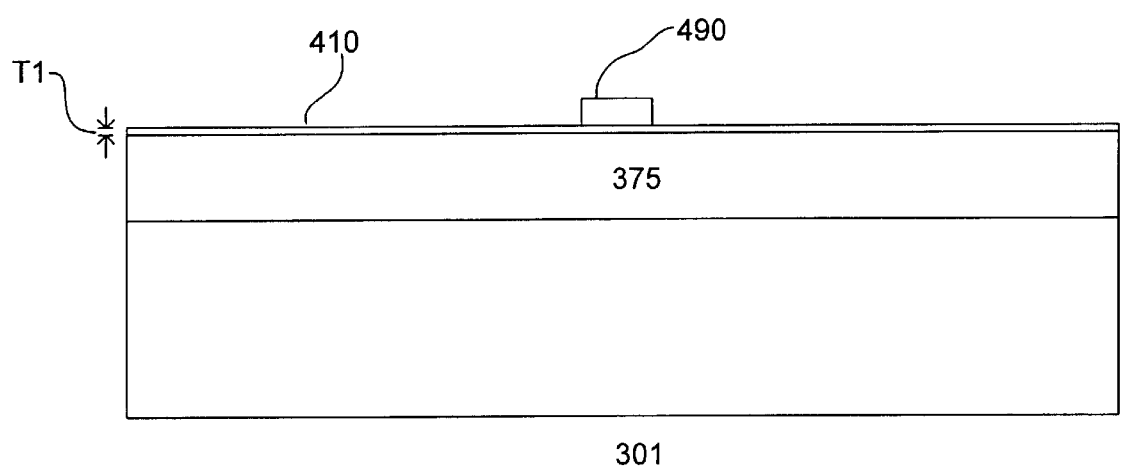
FIGS. 4–6 show a process for forming a memory cell in accordance with one embodiment of the invention.
Figure 5:
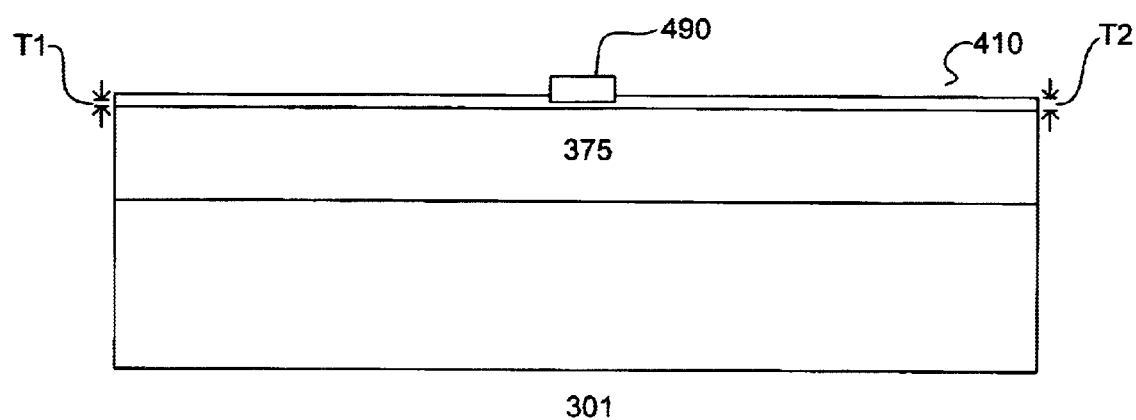
Figure 6:
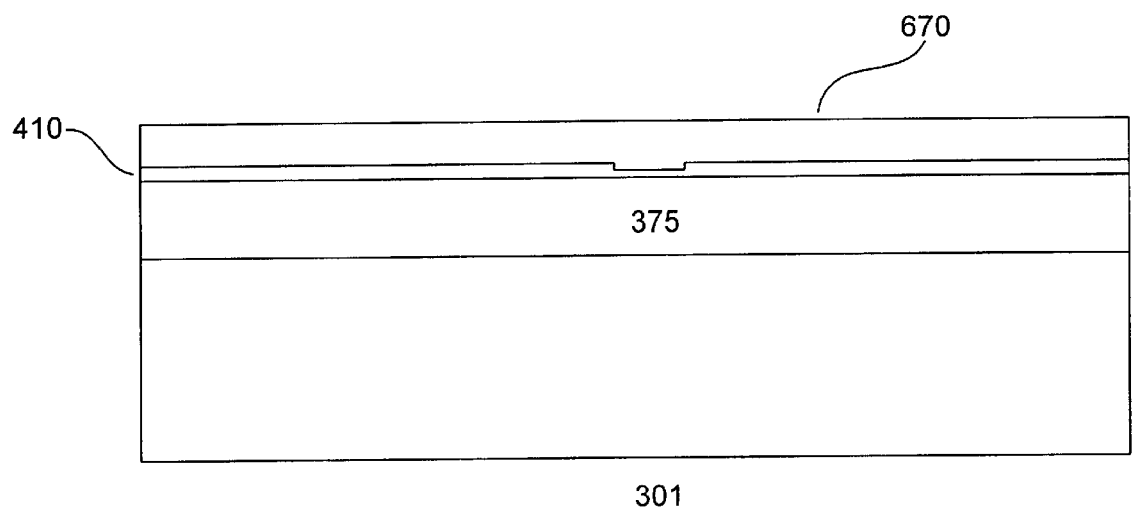

FIGS. 4–6 show a method for fabricating the memory cell in accordance with one embodiment of the invention. As shown, a semiconductor substrate 301 is provided. The substrate, for example, comprises silicon. Other types of semiconductor substrates are also useful. Typically, the substrate is lightly doped with p-type dopants. An implant is performed with p-type dopants to form a heavily doped p-well 375 for n-FETs. In the case where p-FETs are used, a heavily doped n-well is formed.

A dielectric layer 410 layer is formed on the substrate. The dielectric layer comprises, for example, silicon oxide to serve as the gate oxide of the transistors. The silicon oxide is formed by, for example, thermal oxidation. Other techniques for forming silicon oxide are also useful. The dielectric layer comprises a thickness T1, which is equal to the thickness of the gate oxide for storage transistor. In one embodiment, the thickness T1 of the dielectric layer is selected to result in an increase in the capacitance of the storage transistor. Typically T1 is less than the thickness of the gate oxide conventional transistors. Reducing the thickness of the gate oxide results in decreasing the $V_{TS}$ of the storage transistor. The thickness T1 reduces $V_{TS}$ below 0.7V. In one embodiment, the thickness T1 reduces $V_{TS}$ to about 0.3–0.5V. A mask layer 490 is deposited and patterned, leaving a portion remaining to cover the dielectric layer where the gate of the storage transistor is to be formed.

Referring to FIG. 5, the thickness of the dielectric layer 410 is increased from T1 to T2 in the regions unprotected by the mask layer 490. Increasing the thickness of the dielectric layer is achieved by, for example, thermal oxidation. Other techniques, such as CVD, are also useful. The thickness T2 of the dielectric layer corresponds to the thickness of the gate oxide of the access transistors. In one embodiment, the thickness T2 is selected to result in an increase in $V_{Ta}$ in order to reduce leakage current through the channels of the access transistors. In one embodiment, the thickness T2 results in an increase in $V_{Ta}$ by about 0.1–0.5V, preferably by about 0.3–0.4V. The actual thickness T1, and T2 of course, depends on the technology.

Referring to FIG. 6, the mask is removed. A poly layer 670 is formed over the dielectric layer 410. The poly layer, for example, comprises doped poly. Additional layers, such as silicide and nitride cap layers, can be provided to form the gate stack. Subsequently, the gate stack layers are selectively etched to form gates of the transistors as shown in FIG. 3. Diffusion regions are then formed by, for example, ion implantation. Other techniques, such as diffusion, can also be used to form the diffusion regions. Illustratively, the second transistor shares its diffusion regions with the first and third transistors. The first and third transistors serve as access transistors while the second transistor serve as the storage transistor. Additional processing is then performed to complete the memory cell. Such additional processing includes, for example, forming interlevel dielectric layers, contacts, bit lines, word lines, and final passivation.

While the invention has been particularly shown and described with reference to various embodiments, it will be recognized by those skilled in the art that modifications and changes may be made to the present invention without departing from the spirit and scope thereof. The scope of the invention should therefore be determined not with reference to the above description but with reference to the appended claims along with their full scope of equivalents.

What is claimed is:

1. A memory cell comprising:
   first and second high gate threshold voltage access transistors, each with a gate and first and second terminals, wherein the high gate threshold voltage transistors reduce leakage current through channels of the access transistors;
   first and second bit lines, the first bit line coupled to the first terminal of the first access transistor and the second bit line coupled to the first terminal of the second access transistor;
   first and second word lines, the first word line coupled to the first access transistor and the second word line coupled to the second access transistor; and
   a storage transistor having a gate and first and second terminals, the first and second terminals respectively coupled to the second terminals of the first and second access transistors.

2. The memory cell of claim 1 wherein a gate threshold voltage of the high gate threshold voltage transistor is increased by about 0.1–0.4 V.

3. The memory cell of claim 1 wherein a gate threshold voltage of the high gate threshold voltage transistor is increased by about 0.3–0.4 V.

4. The memory cell of claim 2 wherein the storage transistor comprises an increased capacitance.

5. The memory cell of claim 1 wherein the storage transistor comprises an increased capacitance.

6. The memory cell of claim 5 wherein the high gate threshold voltage transistor comprises an increased gate threshold voltage.

7. The memory cell of claim 6 wherein the gate threshold voltage of the high gate threshold voltage transistor is increased by about 0.1–0.4 V.

8. The memory cell of claim 6 wherein the gate threshold voltage of the high gate threshold voltage transistor is increased by about 0.3–0.4 V.

9. The memory cell of claim 6 wherein the high gate threshold voltage transistor comprises an increased gate threshold voltage, the increased, gate threshold voltage comprises either increasing the thickness of the gate dielectric of the high gate threshold transistors, tailoring the dopant profile in channels of the high gate threshold voltage transistors, or a combination thereof.

10. The memory cell of claim 9 wherein the gate threshold voltage of the high gate threshold voltage transistor is increased by about 0.1–0.4 V.

11. The memory cell of claim 9 wherein the gate threshold voltage of the high gate threshold voltage transistor is increased by about 0.3–0.4 V.

12. The memory cell of claim 1 wherein the high gate threshold voltage transistor comprises an increased gate threshold voltage.

13. The memory cell of claim 12 wherein the gate threshold voltage of the high gate threshold voltage transistor is increased by about 0.1–0.4 V.

14. The memory cell of claim 12 wherein the gate threshold voltage of the high gate threshold voltage transistor is increased by about 0.3–0.4 V.

15. The memory cell of claim 1 wherein the high gate threshold voltage transistor comprises an increased gate threshold voltage, the increased gate threshold voltage comprises either increasing the thickness of the gate dielectric of the high gate threshold transistors, tailoring the dopant profile in channels of the high gate threshold voltage transistors, or a combination thereof.

16. The memory cell of claim 15 wherein the gate threshold voltage of the high gate threshold voltage transistor is increased by about 0.1–0.4 V.

17. The memory cell of claim 15 wherein the gate threshold voltage of the high gate threshold voltage transistor is increased by about 0.3–0.4 V.

* * * * *